US012002682B2

(12) United States Patent
Li et al.

(10) Patent No.: US 12,002,682 B2
(45) Date of Patent: Jun. 4, 2024

(54) TIP-TO-TIP GRAPHIC PREPARATION METHOD

(71) Applicant: SHANGHAI IC R&D CENTER CO., LTD, Shanghai (CN)

(72) Inventors: Yanli Li, Shanghai (CN); Yushu Yang, Shanghai (CN); Qiang Wu, Shanghai (CN)

(73) Assignee: SHANGHAI IC R&D CENTER CO., LTD, Shanghai (CN)

( * ) Notice: Subject to any disclaimer, the term of this patent is extended or adjusted under 35 U.S.C. 154(b) by 226 days.

(21) Appl. No.: 17/783,641

(22) PCT Filed: Jul. 23, 2020

(86) PCT No.: PCT/CN2020/103760
§ 371 (c)(1),
(2) Date: Jun. 8, 2022

(87) PCT Pub. No.: WO2021/135179
PCT Pub. Date: Jul. 8, 2021

(65) Prior Publication Data
US 2023/0005751 A1    Jan. 5, 2023

(30) Foreign Application Priority Data
Dec. 30, 2019   (CN) .......................... 201911398950.3

(51) Int. Cl.
*H01L 21/308* (2006.01)
*H01L 21/033* (2006.01)
(Continued)

(52) U.S. Cl.
CPC ...... *H01L 21/3086* (2013.01); *H01L 21/0332* (2013.01); *H01L 21/0337* (2013.01);
(Continued)

(58) Field of Classification Search
None
See application file for complete search history.

(56) References Cited

U.S. PATENT DOCUMENTS

2016/0351410 A1* 12/2016 Fu ..................... H01L 21/76816

FOREIGN PATENT DOCUMENTS

CN          107706095      *  2/2018  .......... H01L 21/033

* cited by examiner

*Primary Examiner* — Jiong-Ping Lu
(74) *Attorney, Agent, or Firm* — Andrew C. Cheng

(57) ABSTRACT

The present invention disclosures a Tip-to-Tip pattern preparation method, comprising: providing a substrate, and sequentially forming a layer to be etched, a first hard mask layer, a second hard mask layer, a sacrificial layer, a first dielectric layer and a first photoresist layer on the substrate, forming a first patterned photoresist layer which has a first Tip-to-Tip pattern by EUV lithography, and transferring the first Tip-to-Tip pattern to the second hard mask layer by etching; then forming a second patterned photoresist layer which has a second Tip-to-Tip pattern by the EUV lithography, and transferring the second Tip-to-Tip pattern to the second hard mask layer by etching; finally, transferring the first Tip-to-Tip pattern and the second Tip-to-Tip pattern to the layer to be etched. The above method needs only performing the EUV lithography twice to form the small-sized Tip-to-Tip pattern with a period halved, that is, the EUV lithography and etching are used for reducing lithography layers and realizing to form the small-sized Tip-to-Tip pattern with the period halved.

10 Claims, 7 Drawing Sheets

(51) Int. Cl.
  *H01L 21/311*       (2006.01)
  *H01L 21/3213*      (2006.01)
  *H01L 21/768*       (2006.01)
(52) U.S. Cl.
  CPC ...... *H01L 21/0338* (2013.01); *H01L 21/3081* (2013.01); *H01L 21/3088* (2013.01); *H01L 21/31144* (2013.01); *H01L 21/32139* (2013.01); *H01L 21/76816* (2013.01)

--Prior Art--

--Prior Art--

--Prior Art--

--Prior Art--

TIP-TO-TIP GRAPHIC PREPARATION METHOD

CROSS-REFERENCE TO RELATED APPLICATION

This application claims priority of International Patent Application Serial No. PCT/CN2020/103760, filed Jul. 23, 2020, which is related to and claims priority of Chinese Patent Application Serial No. CN201911398950.3, filed Dec. 30, 2019. The entirety of each of the above-mentioned patent applications is hereby incorporated herein by reference and made a part of this specification.

TECHNICAL FIELD

The disclosure relates to the technical field of semiconductors, in particular to a Tip-to-Tip pattern preparation method.

BACKGROUND

Lithography is a process that transferring desired patterns to a substrate (usually the target area of the substrate), so as to create the patterns in different device current regions. Specifically, the lithography realizes to transfer the patterns to a photoresist layer (a material is a photosensitive resist) on the surface of the substrate by exposing.

In the prior art, if it is necessary to form a small periodical and small-sized Tip-to-Tip pattern, in addition to multiple lithography steps for two main patterns, two extra multiple lithography steps for lithography cutting layers are required, all of the patterns are formed on amorphous silicon (α-Si) and finally transferred to a hard mask layer. Please refer to FIG. 1a~1b, the two extra multiple lithography steps for the lithography cutting layers are as follows: successively forming a layer 02 to be etched, a hard mask layer 03 and an amorphous Si layer 04 on a substrate 01, depositing a cutting layer material on the amorphous Si layer 04, forming a first cutting layer 0402 and a cutting layer opening 0401 in the amorphous Si layer 04 by lithography and etching, thus a small-size first pattern can be formed on the amorphous Si layer 04 after exposing a first main pattern and etching subsequently, and then forming an organic carbon layer 05 and a silicon oxide layer 06 on the cutting layer opening 0401, the amorphous Si layer 04 and the upper surface of the hard mask layer 03 where the first cutting layer 0402 are positioned; forming a second cutting layer 07 and an opening 0403 by depositing a spacer material, coating photoresist and performing lithography and etching, thus a small-size second pattern can be formed on the amorphous Si layer 04 after exposing a second main pattern and etching subsequently; finally, the first main pattern and the second main pattern are transferred from the amorphous Si to the hard mask layer.

How to form a small periodical and small-sized Tip-to-Tip pattern and save lithography cutting layers simultaneously is a problem currently concerned.

SUMMARY

The object of the present invention is to provide a Tip-to-Tip pattern preparation method. Extreme ultraviolet lithography (EUV) and etching are used for saving lithography cutting layers and achieving a half-cycle and small-sized Tip-to-Tip pattern.

In order to achieve the above objective, the present invention provides a Tip-to-Tip pattern preparation method, comprising:

step S1: providing a substrate, and sequentially forming a layer to be etched, a first hard mask layer, a second hard mask layer, a sacrificial layer, a first dielectric layer and a first photoresist layer on the substrate, performing EUV lithography on the first photoresist layer to form a first patterned photoresist layer, which has a first Tip-to-Tip pattern;

step S2: using the first patterned photoresist layer as a mask, sequentially etching the first dielectric layer and the sacrificial layer to the upper surface of the second hard mask layer, thus forming a patterned sacrificial layer which has the first Tip-to-Tip pattern;

step S3: forming a spacer layer on the sidewall of the patterned sacrificial layer to fill Tip-to-Tip spaces of the first Tip-to-Tip pattern and expose a part of the upper surface of the second hard mask layer in other area;

step S4: forming a patterned protective layer to mask areas exposed by the patterned sacrificial layer and the spacer layer and expose the upper surface of the patterned sacrificial layer, using the patterned protective layer as a mask to remove the patterned sacrificial layer and the second hard mask layer thereunder, thus exposing a part of the upper surface of the first hard mask layer;

step S5: removing the patterned protective layer and sequentially forming a second dielectric layer and a second photoresist layer above the first hard mask layer, the second hard mask layer, and the spacer layer, and performing the EUV lithography on the second photoresist layer to form a second patterned photoresist layer, which has a second Tip-to-Tip pattern, the second Tip-to-Tip pattern and the first Tip-to-Tip pattern are interlaced;

step S6: using the second patterned photoresist layer as a mask, sequentially etching the second dielectric layer, the spacer layer and the second hard mask layer to the upper surface of the first hard mask layer, thus transferring the second Tip-to-Tip pattern into the spacer layer and the second hard mask layer;

step S7: removing the second patterned photoresist layer and the second dielectric layer, using the spacer layer and the second hard mask layer as a mask and etching the first hard mask layer and the layer to be etched to the upper surface of the substrate, thus forming a Tip-to-Tip pattern composed of the first Tip-to-Tip pattern interlaced with the second Tip-to-Tip pattern in the layer to be etched.

Further, the first hard mask layer comprises a metal nitride layer or a metal conductive layer; the layer to be etched comprises a low-K dielectric layer and a TEOS layer thereon, the first hard mask layer is covered above the TEOS layer.

Further, in step S1, the first Tip-to-Tip pattern comprises multiple first Tip-to-Tip lines and trenches between the adjacent first Tip-to-Tip lines, each of the first Tip-to-Tip lines has a first Tip-to-Tip space, line width of each of the first Tip-to-Tip lines is 14 nm~24 nm, line width of each of the trenches between the adjacent first Tip-to-Tip lines is 26 nm~36 nm, and line width of each the first Tip-to-Tip space is 18 nm~25 nm; in step S7, line width of each of Tip-to-Tip lines in the Tip-to-Tip pattern is 10 nm~15 nm, line width of each of trenches between the adjacent Tip-to-Tip lines is 10 nm~15 nm, and line width of a Tip-to-Tip space in each of the Tip-to-Tip lines is 20 nm~25 nm.

Further, in step S1, the trenches in the first Tip-to-Tip pattern are periodic and corresponding periodic width thereof is 40 nm~60 nm; in step S7, the trenches in the Tip-to-Tip pattern are periodic and corresponding periodic width thereof is 20 nm~30 nm.

Further, in step S4, the formation process of the patterned protective layer comprises: step S41: coating a protective layer on the upper surfaces of the patterned sacrificial layer, the spacer layer and the second hard mask layer, the upper surface of the protective layer is not lower than the upper surface of the patterned sacrificial layer; step S42: removing the excess protective layer to form the patterned protective layer, the upper surface of the patterned protective layer is flush with the upper surface of the patterned sacrificial layer.

Further, the protective layer comprises an organic carbon layer.

Further, in step S3, the formation process of the spacer layer comprises: step S31: coating a spacer material on the upper surfaces of the patterned sacrificial layer and the second hard mask layer; step S32: retaining the spacer material on the side wall of the patterned sacrificial layer and in the first Tip-to-Tip spaces of the first Tip-to-Tip pattern, and removing the excess spacer material.

Further, the thickness of the spacer layer is 13 nm~15 nm.

Further, in step S32, removing the excess spacer material by a dry etching process.

Further, the material of the spacer layer comprises $TiO_x$, wherein x is any value between 1 and 2.

In summary, the present invention discloses the Tip-to-Tip pattern preparation method, the first Tip-to-Tip pattern and the second Tip-to-Tip pattern are transferred to the second hard mask layer by performing the EUV lithography twice, and then transferred to the layer to be etched by etching. Since the exposure wavelength of the EUV lithography is very short and lithography resolution thereof is very high, the preparation method of the Tip-to-Tip pattern provided by the present invention only requires performing the EUV lithography twice and realizes to form the small-sized Tip-to-Tip pattern with the period halved, that is, there is no need to add extra lithography layers for the small-sized Tip-to-Tip pattern. Therefore, the Tip-to-Tip pattern preparation method of the present invention adopts the EUV lithography and etching, which are used for reducing lithography layers and realizing to form the small-sized Tip-to-Tip pattern with the period halved.

Figure 1A:
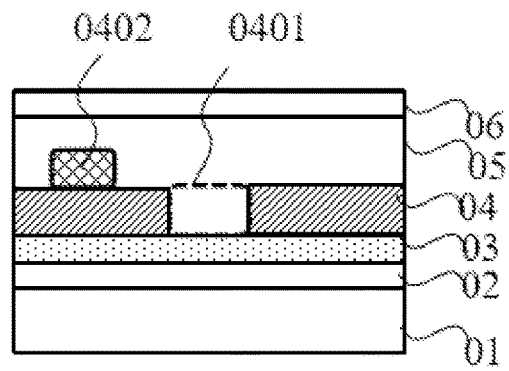
FIG. 1a-2b show an extra lithography process of forming a small-sized Tip-to-Tip pattern.
Figure 1B:
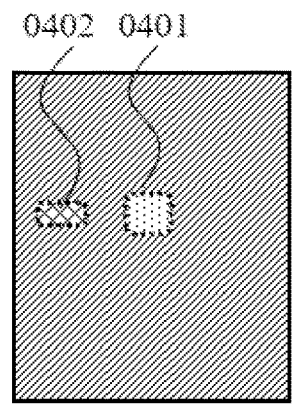
Figure 2A:
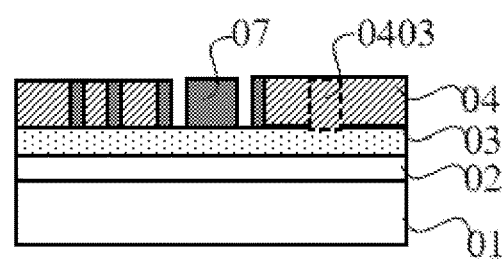
Figure 2B:
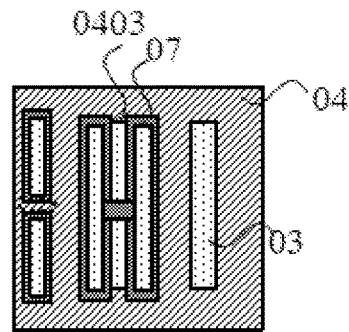

wherein, in FIG. 1a-2b:
01—substrate, 02—layer to be etched, 03—hard mask layer, 04—amorphous Si layer, 0401—cutting layer opening, 0402—first cutting layer, 0403—opening, 05—organic carbon layer, 06—silicon oxide layer, 07—second cutting layer;

in FIG. 3a-11:
10—Substrate, 20—layer to be etched, 201—low-K dielectric layer, 2011—patterned low-K dielectric layer, 202—TEOS layer, 2021—patterned TEOS layer, 30—first hard mask layer, 301—patterned first hard mask layer, 40—second hard mask layer, 401—first patterned second hard mask layer, 402—second patterned second hard mask layer, 50—sacrificial layer, 501—patterned sacrificial layer, 60—first dielectric layer, 601—first organic carbon layer, 602—first anti—reflection layer, 61—second dielectric layer, 611—second organic carbon layer, 612—second anti—reflective layer, 70—first patterned photoresist layer, 71—second patterned photoresist layer, 80—spacer layer, 801—pre—spacer layer, 90—protective layer, 901—patterned protective layer.

DETAILED DESCRIPTION

In order to make the objectives, technical solutions and advantages of the present invention clearer, the specific embodiments of the present invention will be further described in detail below in conjunction with the accompanying drawings.

In order to achieve a purpose of saving lithography layers and forming a small-sized and small periodical Tip-to-Tip pattern through lithography and etching, the present invention provides a Tip-to-Tip pattern preparation method, please refer to FIG.3a-11, the Tip-to-Tip pattern preparation method comprises:

step S1: providing a substrate 10, and sequentially forming a layer 20 to be etched, a first hard mask layer 30, a second hard mask layer 40, a sacrificial layer 50, a first dielectric layer 60 and a first photoresist layer on the substrate 10, performing EUV lithography on the first photoresist layer to form a first patterned photoresist layer, which has a first Tip-to-Tip pattern;

step S2: using the first patterned photoresist layer 70 as a mask, sequentially etching the first dielectric layer 60 and the sacrificial layer 50 to the upper surface of the second hard mask layer 40, thus forming a patterned sacrificial layer 501 which has the first Tip-to-Tip pattern;

step S3: forming a spacer layer 80 on the sidewall of the patterned sacrificial layer 501 to fill Tip-to-Tip spaces of the first Tip-to-Tip pattern and expose a part of the upper surface of the second hard mask layer 40 in other area;

step S4: forming a patterned protective layer 901 to mask areas exposed by the patterned sacrificial layer 501 and the spacer layer 80 and expose the upper surface of the patterned sacrificial layer 501, using the patterned protective layer 901 as a mask to remove the patterned sacrificial layer 501 and the second hard mask layer 40 thereunder, thus exposing a part of the upper surface of the first hard mask layer 30;

step S5: removing the patterned protective layer 901 and sequentially forming a second dielectric layer 61 and a second photoresist layer above the first hard mask layer 30, the second hard mask layer 40, and the spacer layer 80, and performing the EUV lithography on the second photoresist layer to form a second patterned photoresist layer 71 which has a second Tip-to-Tip pattern, the second Tip-to-Tip pattern and the first Tip-to-Tip pattern are interlaced;

step S6: using the second patterned photoresist layer 71 as a mask, sequentially etching the second dielectric layer 61, the spacer layer 80 and the second hard mask layer 40 to the upper surface of the first hard mask layer 30, thus transferring the second Tip-to-Tip pattern into the spacer layer 80 and the second hard mask layer 40;

step S7: removing the second patterned photoresist layer 71 and the second dielectric layer 61, using the spacer layer 80 and the second hard mask layer 40 as a mask, and etching the first hard mask layer 30 and the layer 20 to be etched to the upper surface of the substrate 10, thus forming a Tip-to-Tip pattern composed of the first Tip-to-Tip pattern interlaced with the second Tip-to-Tip pattern in the layer 20 to be etched.

Figure 3A:
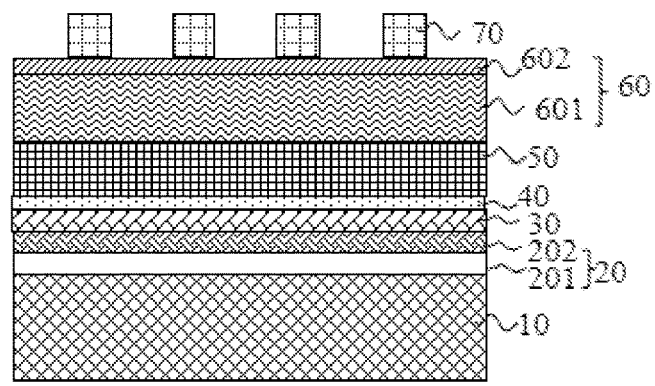
FIG. 3a-3b are a cross-sectional view and a top view of a first patterned photoresist layer in an embodiment of the present invention.
Figure 3B:
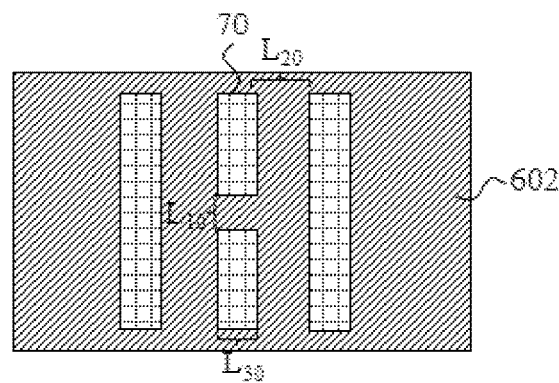

Please refer to FIGS. 3a and 3b, in step S1, providing the substrate 10, the substrate 10 can be a silicon substrate, another commonly used substrate, or a substrate with a semiconductor structure, which is not limited herein. The layer 20 to be etched is formed on the substrate 10 and preferably comprises a low-K dielectric layer 201 and a TEOS layer 202 thereon.

Forming the first hard mask layer 30 on the layer 20 to be etched, the first hard mask layer 30 can be a metal nitride layer or a metal conductive layer, such as a TiN layer. In the embodiment, the first hard mask layer 30 is covered on the TEOS layer 202, the second hard mask layer 40 is formed above the first hard mask layer 30, and the preferred material of the second hard mask layer 40 is silicon nitride. A sacrificial layer 50 is formed above the second hard mask layer 40. The sacrificial layer 50 is preferably an amorphous silicon layer, which needs to has a higher etching selection ratio compared with the second hard mask layer 40 and subsequent layers overlying thereon during an etching process. The first dielectric layer 60 is formed on the sacrificial layer 50 and comprise a first organic carbon layer (SOC) 601 and a first anti-reflection layer 602 positioned thereon. Preferably, the first anti-reflection layer 602 and a second anti-reflection layer 612 formed lately are bottom anti-reflective coatings (BARC). Forming a first photoresist layer above the first dielectric layer 60, and performing the EUV lithography (extreme ultraviolet lithography) on the first photoresist layer to form the first patterned photoresist layer 70, the pattern of the first patterned photoresist layer 70 is the first pattern, which is the first Tip-to-Tip pattern. Since the exposure wavelength of the EUV lithography is very short and the resolution thereof is extremely high, thus the small-sized first Tip-to-Tip pattern can be formed by the EUV lithography. The first Tip-to-Tip pattern comprises multiple first Tip-to-Tip lines and trenches between the adjacent first Tip-to-Tip lines, each of the first Tip-to-Tip lines has a first Tip-to-Tip space, line width $L_{30}$ of each of the first head lines is 14 nm~24 nm, line width $L_{20}$ of each of the trenches between the adjacent first Tip-to-Tip lines is 26 nm~36 nm, line width $L_{10}$ of each the first Tip-to-Tip space is 18 nm~25 nm; the line width of each the Tip-to-Tip space in the first Tip-to-Tip pattern has reached the minimum value. The trenches (lateral trenches) in the first Tip-to-Tip pattern have periodicity, corresponding periodic width thereof is 40 nm~60 nm.

Figure 4A:
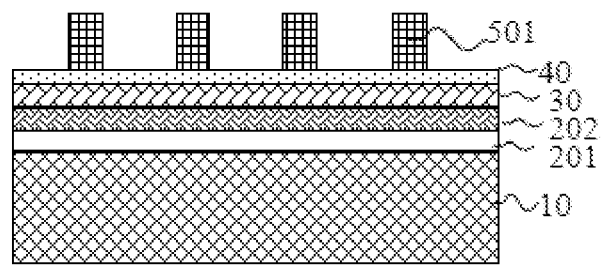
FIG. 4a-4b are a cross-sectional view and a top view of a patterned sacrificial layer in an embodiment of the present invention.
Figure 4B:
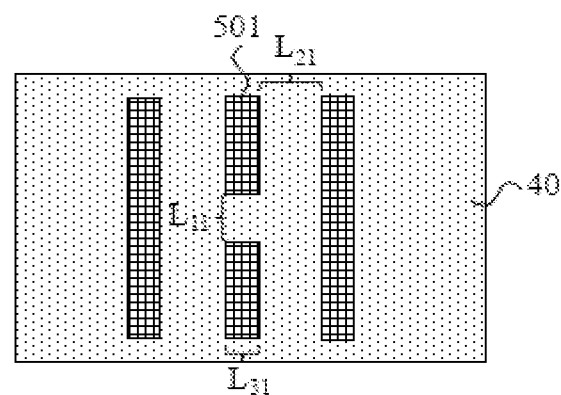
Figure 5A:
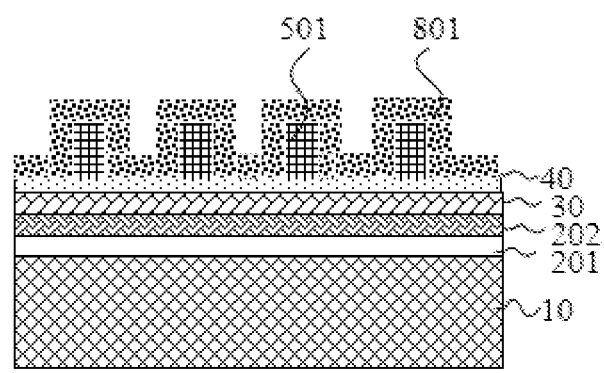
FIG. 5a-5c are a top view of a spacer layer and a process diagram of forming the spacer layer according to an embodiment of the present invention.
Figure 5B:
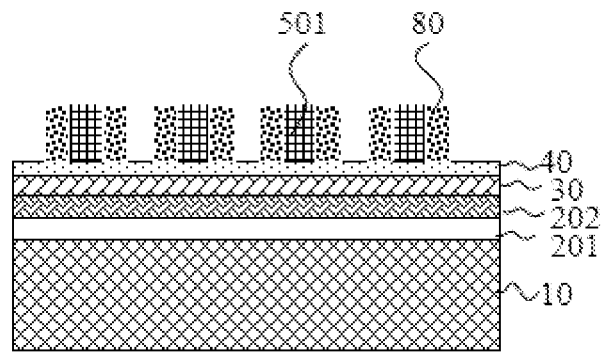
Figure 5C:
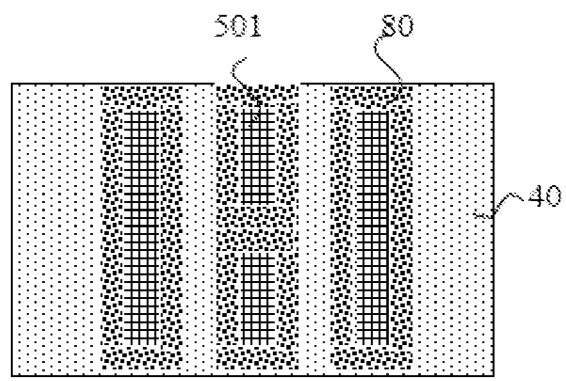
Figure 6A:
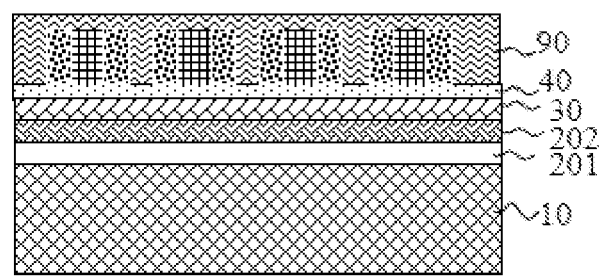
FIG. 6a-6c are process diagrams of forming a first patterned second hard mask layer in an embodiment of the present invention.
Figure 6B:
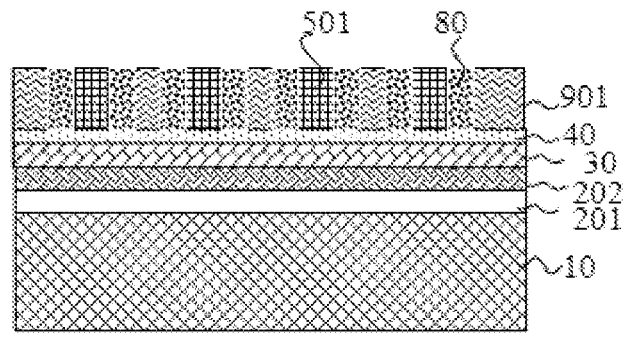
Figure 6C:
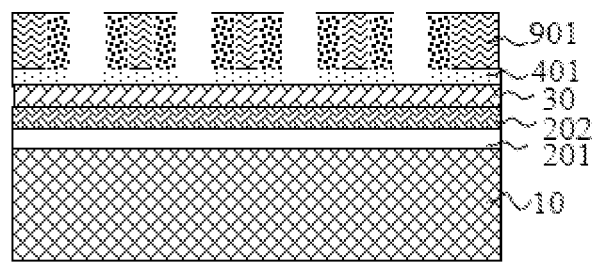

Please refer to FIGS. 4a and 4b, in step S2, using the first patterned photoresist layer 70 as a mask, sequentially etching the first dielectric layer 60 and the sacrificial layer 50 and stopping at the upper surface of the second hard mask layer 40 to form a patterned sacrificial layer 501 which has the first Tip-to-Tip pattern. That is, the pattern of the first patterned photoresist layer 70 is transferred to the first dielectric layer 60 and the sacrificial layer 50 by etching. The first Tip-to-Tip pattern in the patterned sacrificial layer 501 also comprises multiple first Tip-to-Tip lines and trenches between adjacent first Tip-to-Tip lines, and each of the first Tip-to-Tip lines has a first Tip-to-Tip space, line width $L_{21}$ of the trenches between the adjacent first Tip-to-Tip lines in the patterned sacrificial layer 501 can be 38 nm~45 nm, and line width $L_{31}$ of each of the first Tip-to-Tip lines can be 8 nm~15 nm, line width $L_{11}$ of each the first Tip-to-Tip space can be 20 nm~25 nm. That is, the first Tip-to-Tip pattern in the patterned sacrificial layer 501 and the first Tip-to-Tip pattern in the first photoresist layer can have a certain deviation due to process deviation during pattern transferring, but the first Tip-to-Tip pattern in the patterned sacrificial layer 501 is substantially the same as the first Tip-to-Tip pattern in the first photoresist layer.

Please refer to 5a-5c, in step S3, forming the spacer layer 80 on the sidewall of the patterned sacrificial layer 501 to fill the Tip-to-Tip spaces of the first Tip-to-Tip pattern and expose the part of the surface of the second hard mask layer 40 in other area. Wherein, the formation process of the spacer layer 80 comprises:

step S31: coating a spacer material on the upper surfaces of the patterned sacrificial layer and the second hard mask layer, thus forming a pre-spacer layer 801;

step S32: retaining the spacer material on the side wall of the patterned sacrificial layer and in the Tip-to-Tip spaces of the first Tip-to-Tip pattern, and removing the excess spacer material.

Wherein, the material of the spacer layer 80 is preferably $TiO_x$ (titanium oxide), wherein x is any value between 1 and 2, and the thickness of the spacer layer 80 is preferably 13 nm~15 nm. Removing the excess spacer material to retain the spacer material on the side wall of the patterned sacrificial layer and in the Tip-to-Tip spaces of the first Tip-to-Tip pattern, and remove the spacer material on other positions. Further, a removing method is preferably dry etching, and an etching reagent is preferably $Cl_2$, $BCl_3$, $O_2$, etc.

Please refer to 6a-6c, in step S4, forming the patterned protective layer 901 to mask areas exposed by the patterned sacrificial layer 501 and the spacer layer 80 and expose the upper surface of the patterned sacrificial layer 501. Since a part of the upper surface of the second hard mask layer 40 has been exposed after the formation of the patterned sacrificial layer 501, first coating a protective layer to protect a part of the second hard mask layer where the second pattern is positioned, the protective layer is preferably an organic carbon layer (SOC). The formation process of the patterned protective layer 901 comprises:

step S41: coating a protective material to form the protective layer 90 on the upper surfaces of the patterned sacrificial layer 501, the spacer layer 80 and the second hard mask layer 40.

step S42: removing the excess protective layer, then the patterned protective layer 901 is formed by the remaining protective layer, and the upper surface of the patterned protective layer 901 is flush with the upper surface of the patterned sacrificial layer 501.

Wherein, in step S41, the upper surface of the protective layer 90 is not lower than the upper surface of the patterned sacrificial layer 501.

In step S42, since a part of the protective layer 90 is removed by etching or chemical mechanical polishing, thus the upper surface of the patterned protective layer 901 formed is flush with the upper surface of the patterned sacrificial layer 501.

After forming the patterned protective layer 901, using the patterned protective layer 901 as a mask to remove the patterned sacrificial layer 501 and the second hard mask layer 40 below, so as to expose a part of the surface of the first hard mask layer 30. That is, removing the patterned sacrificial layer 501 by using an etching selection ratio, the second hard mask layer 40 at the position of the patterned sacrificial layer 501 is also removed simultaneously to form a first patterned second hard mask layer 401, etching and stopping on the upper surface of the first hard mask layer 30, which is ready for the subsequent etching the second hard mask layer 40 again and stopping on the upper surface of the first hard mask layer 30. Meanwhile, the first patterned second hard mask layer 401 has the first Tip-to-Tip pattern.

Figure 7A:
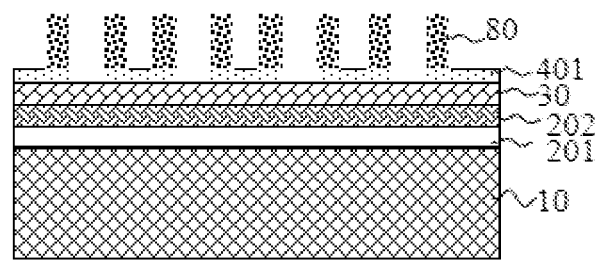
FIG. 7a-7b are a cross-sectional view and a top view of a protective layer removed in an embodiment of the present invention.
Figure 7B:
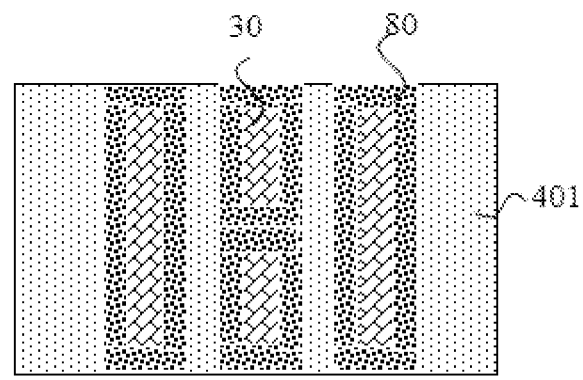
Figure 8:
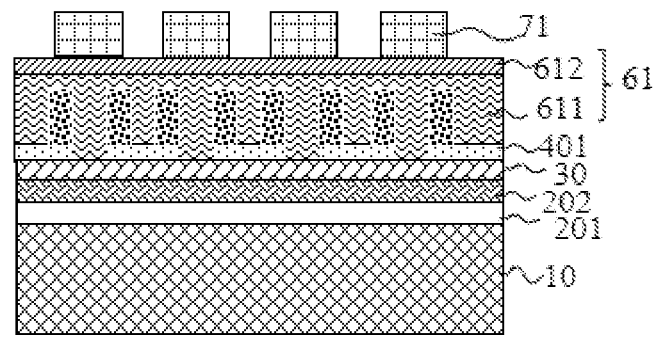
FIG. 8 is a cross-sectional view of a second patterned photoresist layer in an embodiment of the present invention.

Please refer to FIG. 7a-7b and FIG. 8, in step S5, removing the patterned protective layer 901 and sequentially forming a second dielectric layer 61 and a second photoresist layer above the first hard mask layer 30, the second hard mask layer 40 and the spacer layer 80, and performing EUV lithography on the second photoresist layer to form a second patterned photoresist layer 71. Wherein, the second dielectric layer 61 can comprises a second organic carbon layer 611 and a second anti-reflective layer 612 thereon, the pattern of the second patterned photoresist layer 71 is the second pattern, the second patterned photoresist layer 71 has the second Tip-to-Tip pattern, which is interlaced with the first Tip-to-Tip pattern. Taking advantages of the short exposure wavelength and the high resolution of the EUV lithography, the small-sized second Tip-to-Tip pattern can be formed by the EUV lithography and no extra exposure of lithography cutting layers is required. The second Tip-to-Tip pattern comprises multiple second Tip-to-Tip lines and trenches between the adjacent second Tip-to-Tip lines. Each of the second Tip-to-Tip lines has a second Tip-to-Tip space, line width of each of the trenches between the adjacent two Tip-to-Tip lines is 20 nm~26 nm, and line width of each of the second Tip-to-Tip spaces is 18 nm~25 nm. In addition, the trenches in the second Tip-to-Tip pattern have periodicity, and corresponding periodic width thereof can be 40 nm~60 nm. In this embodiment, the patterns of the second patterned photoresist layer 71 and the first patterned photoresist layer 70 can be the same, relative to the first photoresist layer 70, the pattern of the second patterned photoresist layer 71 is simply a position shift to the right or left and a position shift to the front or back relative to the upper surface of the substrate. It should be noticed that, in other embodiments of the present invention, the patterns of the second patterned photoresist layer 71 and the first patterned photoresist layer 70 can also be different, for example, the line widths of the Tip-to-Tip lines are different.

Figure 9A:
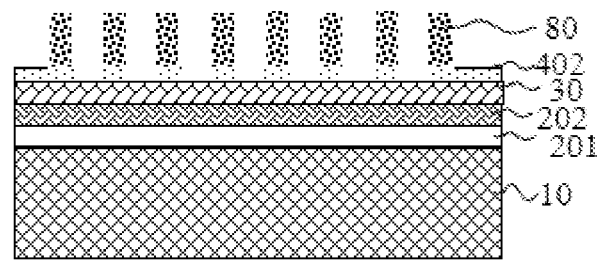
FIG. 9a-9b are a cross-sectional view and a top view of a s second hard mask layer with a second patterned in an embodiment of the present invention.
Figure 9B:
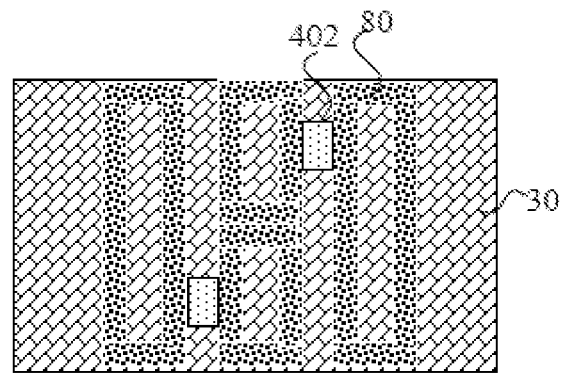

Please refer to FIG. 9a-9b, in step S6, using the second patterned photoresist layer 71 as a mask, sequentially etching the second dielectric layer 61, the spacer layer 80 and the second hard mask layer 40 to the upper surface of the first hard mask layer 30, so as to form a second patterned second hard mask layer 402. The second Tip-to-Tip pattern is transferred to the spacer layer 80 and the second hard mask layer 40, that is, the second Tip-to-Tip pattern is formed in the second patterned second hard mask layer 402. The method for etching the second hard mask layer is preferably self-aligned etching the spacer layer. Meanwhile, the pattern of the second patterned second hard mask layer 402 is composed of the second Tip-to-Tip pattern and the first Tip-to-Tip pattern that are interleaved with each other.

Figure 10:
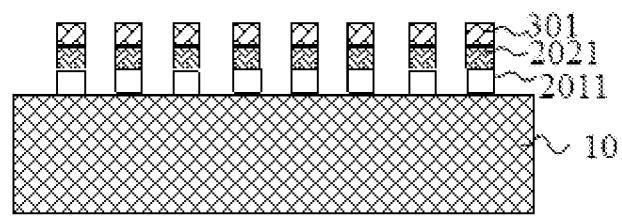
FIG. 10 is a cross-sectional view of a combined Tip-to-Tip pattern in an embodiment of the present invention.
Figure 11:
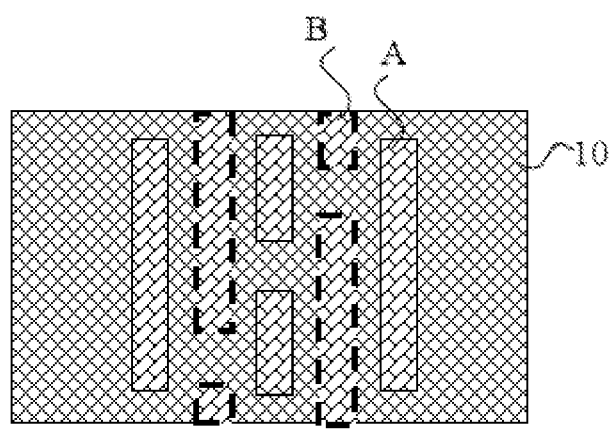
FIG. 11 is the top view of the combined Tip-to-Tip pattern in FIG. 10.

Please refer to FIG. 10, in step S7, removing the second patterned photoresist layer 71 and the second dielectric layer 61, using the spacer layer 80 and the second hard mask layer 40 as a mask to etch the first hard mask layer 30 to form a patterned first hard mask layer 301, and using the patterned first hard mask layer 301 as a mask to etch the layer 20 to be etched to the upper surface of the substrate 10, so as to form the Tip-to-Tip pattern composed of the first Tip-to-Tip pattern interlaced with the second Tip-to-Tip pattern in the layer 20 to be etched. Finally, removing the spacer layer 80 and the second hard mask layer 40.

The specific formation process of the combined Tip-to-Tip pattern comprises: using the second patterned second hard mask layer 402 and the spacer layer 80 as a mask to etch the first hard mask layer 30, so as to form the pattern first hard mask layer 301, and then using the patterned first hard mask layer 301 as a mask to etch the layer 20 to be etched, that is, etching the TEOS layer 202 and the low-K dielectric layer 201, so as to form a patterned TEOS layer 2021 and a patterned low-K dielectric layer 2011. Please refer to FIG. 11, wherein A is the first Tip-to-Tip pattern transferred to the low-K dielectric layer 201, and B is the second Tip-to-Tip pattern transferred to the low-K dielectric layer 201, a final target pattern of the low-K dielectric layer 201 is composed of A and B, that is the Tip-to-Tip pattern composed of the first Tip-to-Tip pattern interlaced with the second Tip-to-Tip pattern. The trenches of the combined Tip-to-Tip pattern have periodicity, and corresponding periodic width thereof is 20 nm~30 nm. Line width of each of the Tip-to-Tip lines of the combined Tip-to-Tip pattern is 10 nm~15 nm, line width of the trench between the adjacent Tip-to-Tip lines is 10 nm~15 nm, and line width of each the Tip-to-Tip space of each of the Tip-to-Tip lines is 20 nm~25 nm. In the present invention, periodic width of a pattern exposed by lithography is 40 nm~60 nm, and periodic width after being exposed twice is 40 nm~60 nm, that is, a period is reduced by half, and the smallest line width of each the smallest Tip-to-Tip space can be 20 nm~25 nm.

Since the exposure wavelength of the EUV lithography can be reduced to 13.5 nm, which is equivalent to $\frac{1}{14}$ of 193 nm, and the shorter the wavelength, the higher the lithography resolution. thus, the EUV lithography can provide extremely high lithography resolution (which can be dozens of nanometers), directly form a small-size pattern, and does not require extra exposures for lithographic cutting layers. On the 5 nm technology node, it is possible to form a small-cycle and small-size Tip-to-Tip pattern exposed twice by the EUV lithography, so as to achieve a purpose of saving lithography layers.

Therefore, the present invention adopts the EUV lithography that can provide extremely high lithography resolution, performing the EUV lithography twice to form a small-sized Tip-to-Tip pattern with a period halved, which does not require extra lithography layers for the Tip-to-Tip pattern, that is, the EUV lithography and etching are used for reducing lithography layers and realizing to form the small-sized Tip-to-Tip pattern with the period halved.

The above descriptions are only the preferred embodiments of the present invention, and the described embodiments are not used to limit the scope of patent protection of the present invention. Therefore, any equivalent structural changes made using the contents of the description and drawings of the present invention should be included of the same reasoning. Within the protection scope of the appended claims of the present invention.

What is claimed is:

1. A Tip-to-Tip pattern preparation method, comprising:

step S1: providing a substrate, and sequentially forming a layer to be etched, a first hard mask layer, a second hard mask layer, a sacrificial layer, a first dielectric layer and a first photoresist layer on the substrate, performing EUV lithography on the first photoresist layer to form a first patterned photoresist layer, which has a first Tip-to-Tip pattern;

step S2: using the first patterned photoresist layer as a mask, sequentially etching the first dielectric layer and the sacrificial layer to the upper surface of the second hard mask layer, thus forming a patterned sacrificial layer which has the first Tip-to-Tip pattern;

step S3: forming a spacer layer on the sidewall of the patterned sacrificial layer to fill Tip-to-Tip spaces of the first Tip-to-Tip pattern and expose a part of the upper surface of the second hard mask layer in other area;

step S4: forming a patterned protective layer to mask areas exposed by the patterned sacrificial layer and the spacer layer and expose the upper surface of the patterned sacrificial layer, using the patterned protective layer as a mask to remove the patterned sacrificial layer and the second hard mask layer thereunder, thus exposing a part of the upper surface of the first hard mask layer;

step S5: removing the patterned protective layer and sequentially forming a second dielectric layer and a second photoresist layer above the first hard mask layer, the second hard mask layer, and the spacer layer, and performing the EUV lithography on the second photoresist layer to form a second patterned photoresist layer, which has a second Tip-to-Tip pattern, the second Tip-to-Tip pattern and the first Tip-to-Tip pattern are interlaced;

step S6: using the second patterned photoresist layer as a mask, sequentially etching the second dielectric layer, the spacer layer and the second hard mask layer to the upper surface of the first hard mask layer, thus transferring the second Tip-to-Tip pattern into the spacer layer and the second hard mask layer;

step S7: removing the second patterned photoresist layer and the second dielectric layer, using the spacer layer and the second hard mask layer as a mask and etching the first hard mask layer and the layer to be etched to the upper surface of the substrate, thus forming a Tip-to-Tip pattern composed of the first Tip-to-Tip pattern interlaced with the second Tip-to-Tip pattern in the layer to be etched.

2. The Tip-to-Tip pattern preparation method of claim 1, wherein the first hard mask layer comprises a metal nitride layer or a metal conductive layer; the layer to be etched comprises a low-K dielectric layer and a TEOS layer thereon, the first hard mask layer is covered above the TEOS layer.

3. The Tip-to-Tip pattern preparation method of claim 1, wherein in step S1, the first Tip-to-Tip pattern comprises multiple first Tip-to-Tip lines and trenches between the adjacent first Tip-to-Tip lines, each of the first Tip-to-Tip lines has a first Tip-to-Tip space, line width of each of the first Tip-to-Tip lines is 14 nm~24 nm, line width of each of the trenches between the adjacent first Tip-to-Tip lines is 26 nm~36 nm, and line width of each the first Tip-to-Tip space is 18 nm~25 nm; in step S7, line width of each of Tip-to-Tip lines in the Tip-to-Tip pattern is 10 nm~15 nm, line width of each of trenches between the adjacent Tip-to-Tip lines is 10 nm~15 nm, and line width of a Tip-to-Tip space in each of the Tip-to-Tip lines is 20 nm~25 nm.

4. The Tip-to-Tip pattern preparation method of claim 3, wherein in step S1, the trenches in the first Tip-to-Tip pattern are periodic and corresponding periodic width thereof is 40 nm~60 nm; in step S7, the trenches in the Tip-to-Tip pattern are periodic and corresponding periodic width thereof is 20 nm~30 nm.

5. The Tip-to-Tip pattern preparation method of claim 1, wherein in step S4, the formation process of the patterned protective layer comprises:

step S41: coating a protective layer on the upper surfaces of the patterned sacrificial layer, the spacer layer and the second hard mask layer, the upper surface of the protective layer is not lower than the upper surface of the patterned sacrificial layer;

step S42: removing the excess protective layer to form the patterned protective layer, the upper surface of the patterned protective layer is flush with the upper surface of the patterned sacrificial layer.

6. The Tip-to-Tip pattern preparation method of claim 5, wherein the protective layer comprises an organic carbon layer.

7. The Tip-to-Tip pattern preparation method of claim 1, wherein in step S3, the formation process of the spacer layer comprises:

step S31: coating a spacer material on the upper surfaces of the patterned sacrificial layer and the second hard mask layer;

step S32: retaining the spacer material on the side wall of the patterned sacrificial layer and in the first Tip-to-Tip spaces of the first Tip-to-Tip pattern, and removing the excess spacer material.

8. The Tip-to-Tip pattern preparation method of claim 7, wherein the thickness of the spacer layer is 13 nm~15 nm.

9. The Tip-to-Tip pattern preparation method of claim 7, wherein in step S32, removing the excess spacer material by a dry etching process.

10. The Tip-to-Tip pattern preparation method of claim 7, wherein the material of the spacer layer comprises $TiO_x$, wherein x is any value between 1 and 2.

* * * * *